(12) United States Patent
Uehara et al.

(10) Patent No.: US 7,483,273 B2
(45) Date of Patent: Jan. 27, 2009

(54) SEMICONDUCTOR MODULE AND SEMICONDUCTOR MODULE HEAT RADIATION PLATE

(75) Inventors: Sumio Uehara, Nagano (JP); Syuzo Aoki, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 85 days.

(21) Appl. No.: 11/420,583

(22) Filed: May 26, 2006

(65) Prior Publication Data

US 2006/0268524 A1 Nov. 30, 2006

(30) Foreign Application Priority Data

May 27, 2005 (JP) ............................. 2005-155570

(51) Int. Cl.
*H05K 7/20* (2006.01)
*H01L 23/36* (2006.01)

(52) U.S. Cl. .................. 361/715; 361/704; 361/719; 361/728; 165/80.3; 165/104.33; 165/185; 174/16.3; 257/719

(58) Field of Classification Search .......... 361/704, 361/707, 709, 710, 715, 719, 720–724, 752, 361/759; 257/718–719, 726–727; 165/80.3, 165/104.33, 185, 80.2; 174/16.3, 252
See application file for complete search history.

(56) References Cited

U.S. PATENT DOCUMENTS

| | | | | |
|---|---|---|---|---|
| 5,892,660 | A * | 4/1999 | Farnworth et al. | 361/728 |
| 5,966,287 | A * | 10/1999 | Lofland et al. | 361/704 |
| 6,088,228 | A * | 7/2000 | Petersen et al. | 361/720 |
| 6,188,576 | B1 | 2/2001 | Ali et al. | |
| 6,282,091 | B1 | 8/2001 | Horng | |
| 6,307,748 | B1 | 10/2001 | Lin et al. | |
| 6,353,538 | B1 * | 3/2002 | Ali et al. | 361/728 |
| 6,362,966 | B1 * | 3/2002 | Ali et al. | 361/728 |
| 6,370,027 | B1 * | 4/2002 | Koizumi et al. | 361/720 |
| 6,377,460 | B1 * | 4/2002 | Pohl et al. | 361/704 |
| 6,449,156 | B1 * | 9/2002 | Han et al. | 361/704 |
| 6,483,702 | B1 * | 11/2002 | Lofland | 361/704 |
| 6,967,843 | B2 * | 11/2005 | Rubenstein et al. | 361/703 |
| 7,023,700 | B2 * | 4/2006 | Chiou et al. | 361/704 |

FOREIGN PATENT DOCUMENTS

| | | | |
|---|---|---|---|
| JP | 404074700 A | * | 3/1992 |
| JP | 2002-134970 | | 5/2002 |

* cited by examiner

*Primary Examiner*—Michael V Datskovskiy
(74) *Attorney, Agent, or Firm*—Rankin, Hill & Clark LLP

(57) ABSTRACT

In a semiconductor module 10 in which a semiconductor device 17 is mounted on both surfaces of a circuit board 11 and heat radiation plates 12a, 12b are provided to both surfaces of the circuit board to cover the semiconductor device, a fitting hole via which the heat radiation plates 12a, 12b are fitted is formed in the circuit board 11, and a housing recess portion 18 in which the semiconductor devices 11 are housed is provided to both heat radiation plates 12a, 12b fitted to both surfaces of the circuit board 11 respectively and a fitting edge portion 25 is provided in a position of both heat radiation plates that overlaps with a position in which the fitting hole is formed, and also a fixing means 20 for fixing both heat radiation plates 12a, 12b to the circuit board 11 by caulking to align with the fitting hole is provided to fitting edge portions 25 integrally with the heat radiation plates 12a, 12b.

12 Claims, 8 Drawing Sheets

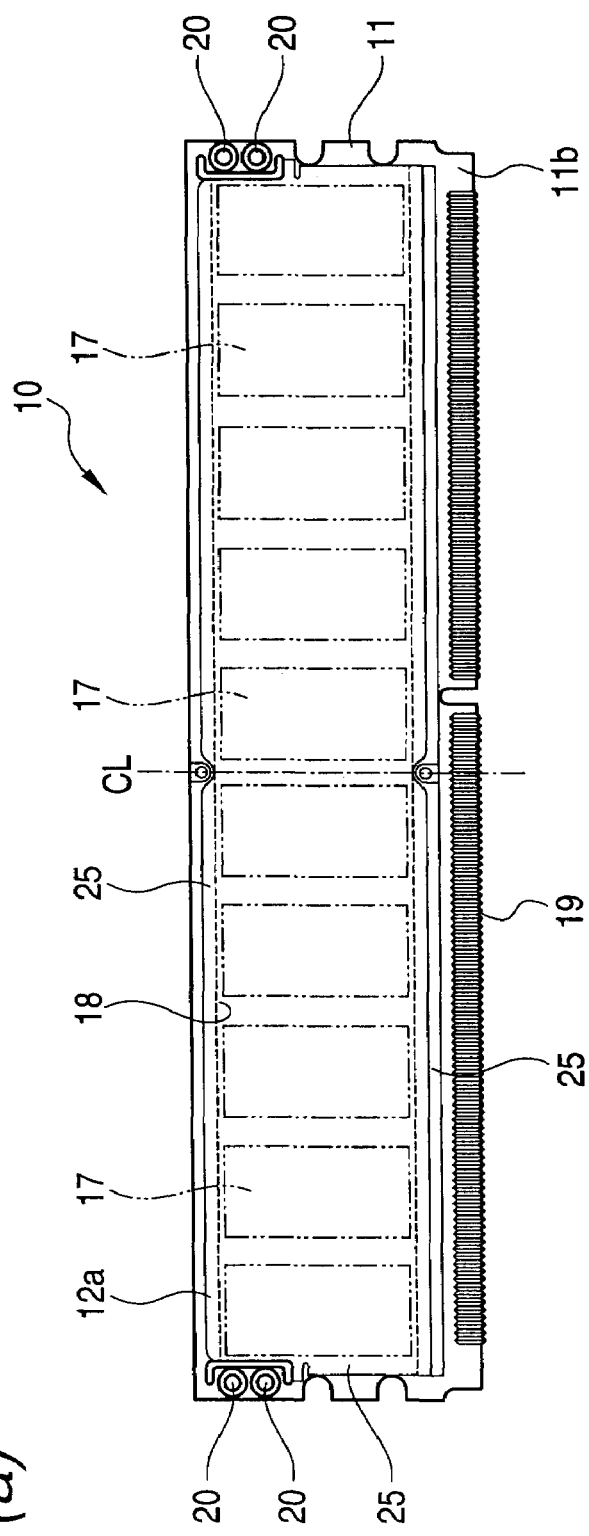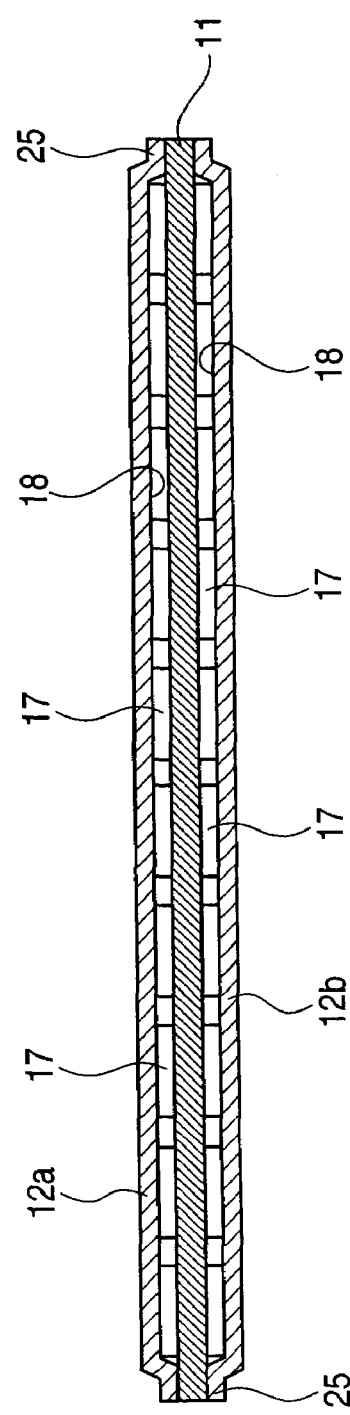
FIG. 1 (a)
FIG. 1 (b)

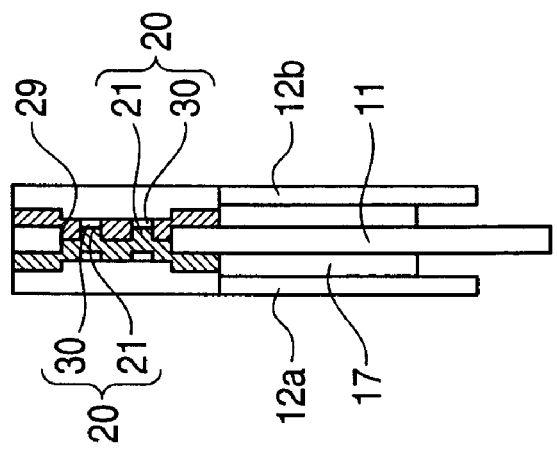
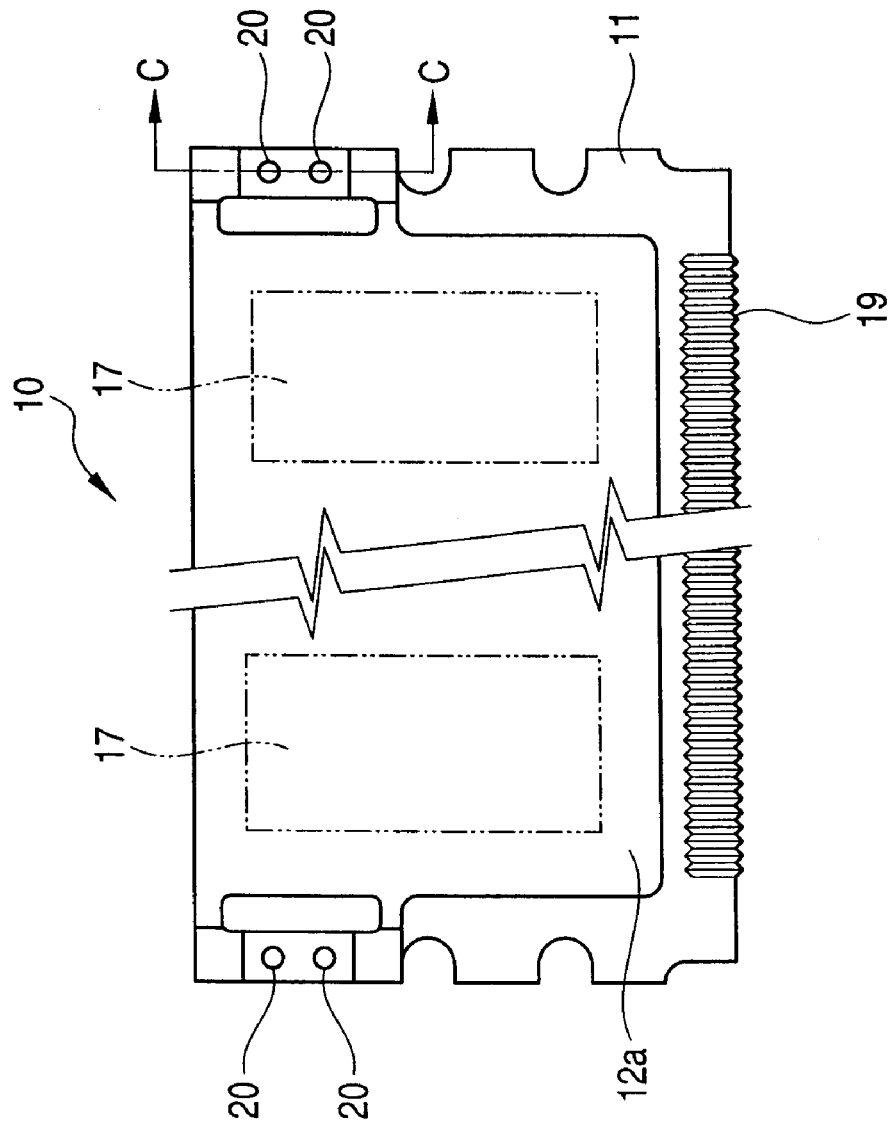
FIG. 4 (a)
FIG. 4 (b)

SEMICONDUCTOR MODULE AND SEMICONDUCTOR MODULE HEAT RADIATION PLATE

TECHNICAL FIELD

The present disclosure relates to a semiconductor module such as a memory module, or the like and a semiconductor module heat radiation plate used in this module.

RELATED ART

A configuration of the semiconductor module in the related art will be explained while taking an extended or expanded memory module used in the personal computer, or the like as an example. FIG. 11 shows a partial sectional view of a memory module 15 having metal plates 36a, 36b as the heat radiation plate. The memory module 15 is constructed by sandwiching both sides of a circuit board 11 by the metal plates 36a, 36b and then securing the metal plates 36a, 36b to the circuit board 11. A plurality of semiconductor memories 17 is mounted respectively on both surfaces of the circuit board 11. A thermal conduction tape 28 for improving a heat dissipation capacity from the semiconductor memories 17 is interposed between the semiconductor memories 17 and the metal plates 36a, 36b respectively.

A planar shape pf the circuit board 11 is formed as an almost rectangle, and a card-edge connector used to get an electrical connection with an external device is provided along one long side.

The metal plates 36a, 36b fitted to the circuit board 11 is formed as an almost rectangle that covers an overall mounted areas of the semiconductor memories 17 mounted on the circuit board 11 except an area in which the card-edge connector is formed. A housing recess portion 18 having a depth at which a back surface of the semiconductor memory 17 comes into contact with the housing recess portion is formed on the metal plates 36a, 36b respectively. The metal plates 36a, 36b come into contact with the circuit board 11 only via peripheral portions of the housing recess portion 18, and thus the metal plates 36a, 36b are secured to the circuit board 11 via these peripheral portions.

In the memory module 15 shown in FIG. 11, through holes 13a, 13b provided in the metal plates 36a, 36b and fitting holes 14 provided in the circuit board 11 are aligned mutually, then rivets 16 are inserted into the through holes 13a, 13b and the fitting holes 14 respectively, and then the metal plates 36a, 36b and the circuit board 11 are riveted together by crashing both ends of the rivets 16.

An approach of fitting the heat radiation plate onto the circuit board using such rivets is employed in the electronic control device set forth in Japanese Patent Document No. 2002-134970, for example.

The method of forming the semiconductor module having the heat radiation plate by fitting the metal plates 36a, 36b onto the circuit board 11, on which the semiconductor memories 17 are mounted, using the rivets 16, as described above, contains such problems that the number of parts constituting the semiconductor module is increased and also the riveting operation is troublesome.

In this case, as a different method from the method of fitting the metal plate (heat radiation plate) by the riveting, there is the method of clamping the metal plates arranged on both sides of the circuit board from the outside using U-shaped clips to fit the metal plates to the circuit board in a situation that the circuit board is put between the metal plates. However, in the case of this method, such a problem exists that alignment between the circuit board and the metal plates cannot be precisely attained.

SUMMARY

The disclosure below describes a semiconductor module heat radiation plate capable of facilitating an assembling operation of a semiconductor module having a heat radiation plate and also constituting a semiconductor module that is excellent in radiation performance, and a semiconductor module using this heat radiation plate.

An example implementation of the invention is described below. A semiconductor module comprising: a circuit board; semiconductor devices mounted on both surfaces of the circuit board; and heat radiation plates provided to the both surfaces of the circuit board to cover the semiconductor devices. The circuit board has a fitting hole via which the heat radiation plates are fitted. Each of heat radiation plates has a housing recess portion in which the semiconductor device is housed. Each of heat radiation plates has a fitting edge portion in a position that overlaps with a position in which the fitting hole is formed. Each of heat radiation plates has a fixing member, which is provided at the fitting edge portion and integrally with the heat radiation plate, for fixing both heat radiation plates to the circuit board by caulking to align with the fitting hole.

Here, the semiconductor device mounted on the circuit board contains the case where the semiconductor device is mounted in its resin sealed state. Also, a concept of the fitting hole via which the heat radiation plate is fitted contains the notch formed by cutting away the end edge portion of the circuit board, in addition to the through hole that is provided to pass through the circuit board.

Also, the fitting edge portion may be provided within a board plane of the circuit board on an outside of the housing recess portion. Therefore, the semiconductor module to which the heat radiation plate is fitted can be assembled in compact.

Also, the fixing member may be formed on one of the heat radiation plates as a fitting projection and may be formed on the other of the heat radiation plates as a fitted hole that engages with the fitting projection. Therefore, the heat radiation plate can be easily fitted to the circuit board by the caulking. Also, the processes of forming the fitting projection and the fitted hole in the heat radiation plate can be executed as one of a series of processing steps that are executed to process the heat radiation plate.

Also, the fitting hole may be formed in plural as a paired arrangement in which arrangement positions are common on front and back surfaces of the circuit board, and the fixing member formed to correspond to one fitting hole as the paired arrangement and the fixing member formed to correspond to other fitting hole as the paired arrangement may be formed on both heat radiation plates as paired structures that are fitted mutually and fixed by caulking. Therefore, the structure of the heat radiation plate fitted to both surfaces of the circuit board can be uniformalized, and the semiconductor module can be constructed only by using one type of heat radiation plate.

Also, the fitting hole may be formed as a notch in both end edges of the circuit board in a longitudinal direction respectively. Therefore, the fitting of the heat radiation plate can be facilitated and also a fitting space required to fit the circuit board to the equipment, or the like can be utilized effectively in fitting the heat radiation plate.

Also, one of the fixing members is formed as a fitting projection and other of the fixing members is formed as a fitted hole that is combined with the fitting projection.

Also, the fitting projection has a first projection inserted into the fitting hole and a second projection formed to project from an end surface of the first projection, the fitted hole is formed to have a diameter dimension through which the second projection is inserted into a projected portion that is inserted into the fitting hole, and then fixed by caulking, and a height sum of the first projection and a level difference portion of the projected portion coincides with a thickness of the circuit board.

Also, the fitting projection has a first projection inserted into the fitting hole and a second projection formed to project from an end surface of the first projection, the fitted hole is formed to have a diameter dimension through which the second projection is inserted and then fixed by caulking, and a height of a level difference portion of the first projection coincides with a thickness of the circuit board. Therefore, the heat radiation plates can be fitted to the circuit board in precise alignment only when the heat radiation plates are fitted to the circuit board by combining the fitting projections with the fitted holes, and thus the semiconductor module can be assembled simply into a condition that the circuit board is put between the radiation boards.

Also, there is provided a semiconductor module heat radiation plate used in assembling the semiconductor module in which the fitting hole formed in a circuit board is formed in plural as a paired arrangement in which arrangement positions are common on front and back surfaces of the circuit board, wherein a fixing member formed to correspond to one fitting hole as the paired arrangement and a fixing member formed to correspond to other fitting hole as the paired arrangement are formed on the heat radiation plate as paired structures with the other heat radiation plate with the same structure that are fitted mutually and fixed by caulking.

Also, one of the fixing members is formed as a fitting projection and other of the fixing members is formed as a fitted hole that is combined with the fitting projection. Therefore, the semiconductor module can be assembled by fitting simply the heat radiation plates to the circuit board.

Various implementations may include one or more the following advantages. For example, since the semiconductor module according to the present invention is formed by fixing the heat radiation plates to the circuit board by caulking while utilizing the fixing means that are formed integrally with the heat radiation plate, such module can be assembled extremely simply. Also, since the fixing means are formed integrally with the heat radiation plate, the handling of the parts can be made easy. Also, the semiconductor module heat radiation plate according to the present invention can be fitted to both surfaces of the circuit board by preparing one type of heat radiation plate, so that the assembling operation can be facilitated and also a production cost can be reduced.

Other features and advantages may be apparent from the following detailed description, the accompanying drawings and the claims.

BRIEF DESCRIPTION OF THE DRAWINGS

FIG. 1(a) is a plan view showing a configuration of a semiconductor module according to the present invention.

FIG. 1(b) is a sectional view showing the configuration of the semiconductor module according to the present invention.

FIG. 4(a) is a plan view showing a fitting structure in a state that the heat radiation plate is fitted to the circuit board.

FIG. 4(b) is a sectional view showing the fitting structure in a state that the heat radiation plate is fitted to the circuit board.

DETAILED DESCRIPTION

Figure 2:
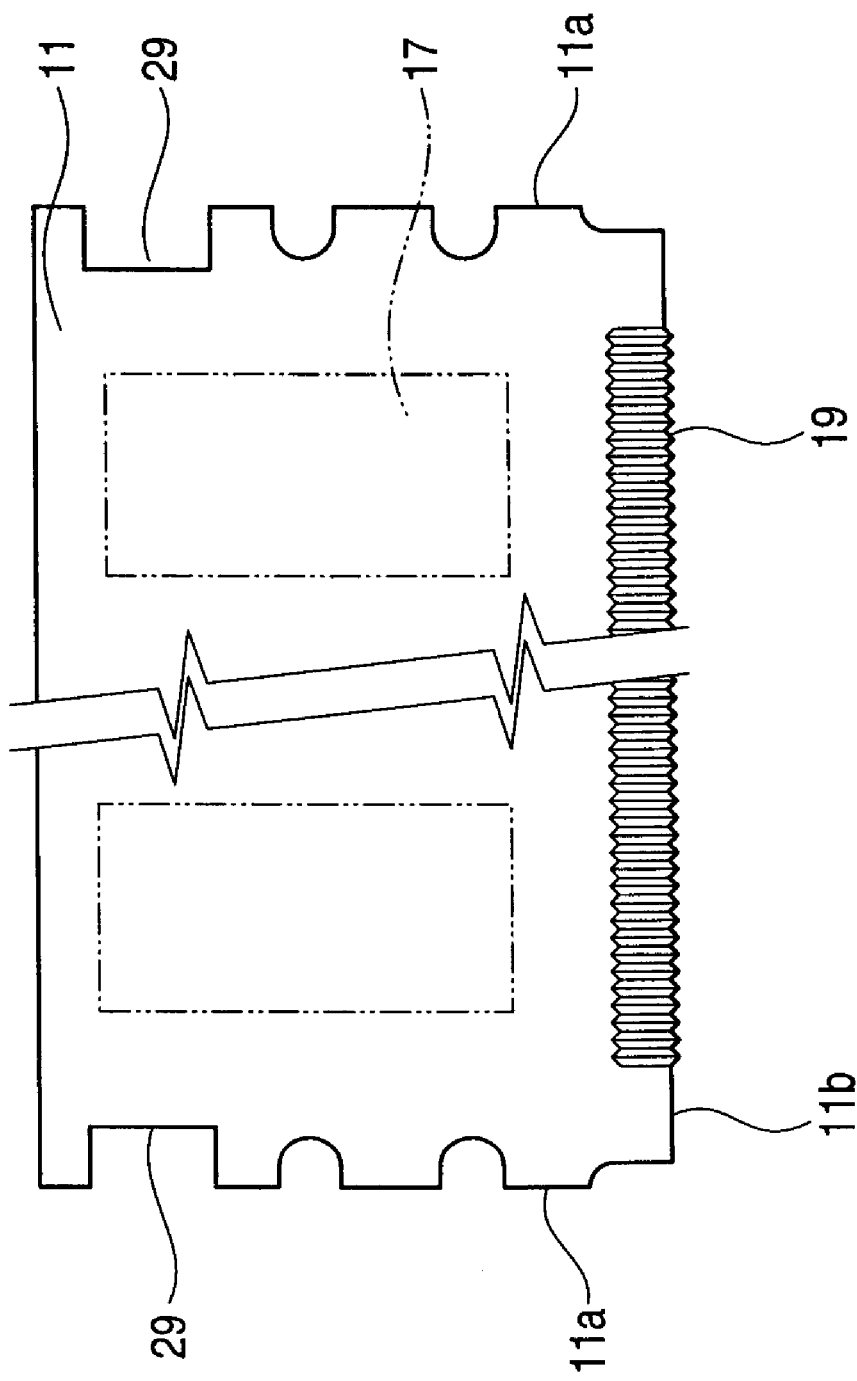
FIG. 2 is an explanatory view showing a structure of a short side portion of a circuit board in an enlarged manner.

As an embodiment of a semiconductor module according to the present invention, an extended or expanded memory module used in the personal computer, or the like will be explained hereinafter. Here, the semiconductor module according to the present invention is also applicable to the semiconductor module in which a semiconductor device other than a semiconductor memory is packaged or the semiconductor module in which a semiconductor device is packaged.

FIG. 1(a) shows a plan view of a memory module 10, and FIG. 1(b) shows a sectional view of the memory module 10. The memory module 10 comprises the circuit board 11 on both surfaces of which a plurality of semiconductor memories 17 are mounted respectively, and metal plates 12a, 12b formed to put the circuit board 11 between them to act as a semiconductor module heat radiation plate.

The metal plates 12a, 12b are formed by using a metal member such as copper, aluminum, or the like. As shown in FIG. 1(b), a housing recess portion 18 in which the semiconductor memories 17 are housed is formed on the surface sides of the metal plates 12a, 12b, which face to the circuit board 11, respectively. The housing recess portion 18 is formed by applying the press working to a metal member, and a peripheral portion of the housing recess portion 18 acts as a fitting edge portion 25 formed as a flat surface. The housing recess portion 18 which houses the semiconductor memories 17 therein is formed on the metal plates 12a, 12b, and back surfaces of the semiconductor memories 17 mounted on the circuit board 11 come into contact with inner surfaces of the metal plates 12a, 12b in a state that the metal plates 12a, 12b are fitted to the circuit board 11.

The metal plates 12a, 12b are fitted to the circuit board 11 by fixing members 20 provided on both end portions (the fitting edge portions 25) in the longitudinal direction. The structure of the fixing member 20 will be explained later.

A planar shape of the circuit board 11 is formed as an almost rectangle, and a plurality of semiconductor memories 17 are mounted at a predetermined interval in the longitudinal direction of the circuit board 11. A card-edge connector (terminal portion) 19 to get an electrical connection to an external device is provided to one long side 11b of the circuit board 11.

A neighboring portion of a short side 11a of the circuit board 11 is shown in FIG. 2 in an enlarged manner. Notches 29, 29 acting as fitting holes are provided to end edges of the short sides 11a, 11a of the circuit board 11. The notches 29, 29 are formed by cutting the end edge like a rectangle on the sides of both the short sides 11a, 11a of the circuit board 11, which is away from the card-edge connector 19. Also, the notches 29, 29 formed on both end edges of the circuit board 11 are formed in bilaterally symmetrical positions about a centerline CL (see FIG. 1) of the circuit board 11.

Figure 3:
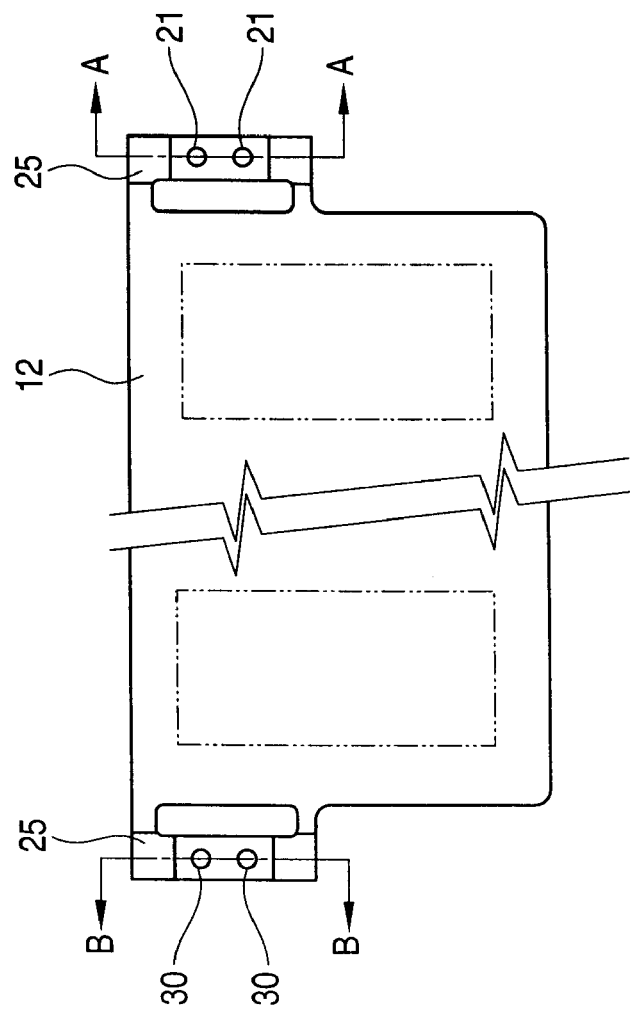
FIG. 3(a) is a plan view showing a fitting structure of a heat radiation plate.
FIGS. 3(b), (c) are partial sectional views showing the fitting structure of the heat radiation plate.

A configuration of one metal plate 12a fitted to the circuit board 11 is shown in FIG. 3 in an enlarged manner. FIG. 3(a) shows a configuration of the end edge portions of the metal plate 12a in the longitudinal direction in an enlarged manner, and FIG. 3(b) (c) show sectional views taken along an A-A line and a B-B line of FIG. 3(a) respectively.

Fitting projections 21 as the fixing member 20 are formed on the fitting edge portion 25 formed on one end edge of the metal plate 12a in the longitudinal direction. Fitted holes 30 as the fixing member 20 are formed on the fitting edge portion 25 formed on the other end edge of the metal plate 12a in the longitudinal direction. As shown in FIG. 3(a), in the present embodiment, two fitting projections 21 are formed on one end edge of the metal plate 12a and two fitted holes 30 are formed on the other end edge. The fitting projections 21 and the fitted holes 30 are formed to be aligned with the notches 29, 29 that are provided to both end edges (short sides) of the circuit board 11 in the longitudinal direction.

The fitting projections 21 and the fitted holes 30 are formed in bilaterally symmetrical positions about a centerline CL of the metal plate 12a. The fitting projections 21 and the fitted holes 30 are fitted mutually when they are engaged with each other.

In this case, the other metal plate 12b fitted to the circuit board 11 is formed to have a totally same shape as one metal plate 12a including the fitting projections 21 and the fitted holes 30. In this manner, since the metal plates 12a, 12b to which the fitting projections 21 and the fitted holes 30 are provided are employed, two sheets of metal plates 12a, 12b are fitted to the circuit board 11 by the fitting projections 21 and the fitted holes 30 as the fixing members 20 to put the circuit board 11 between them.

Figure 5:
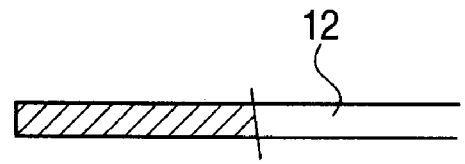
FIGS. 5(a) to (d) are explanatory views showing steps of forming a fitting projection on the heat radiation plate.
Figure 5:
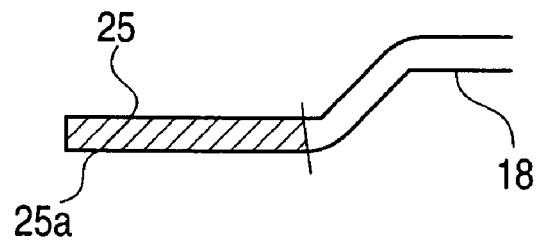
Figure 5:
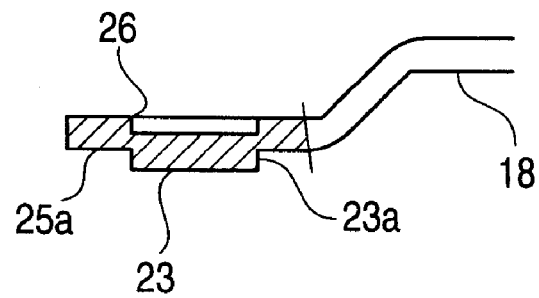
Figure 5:
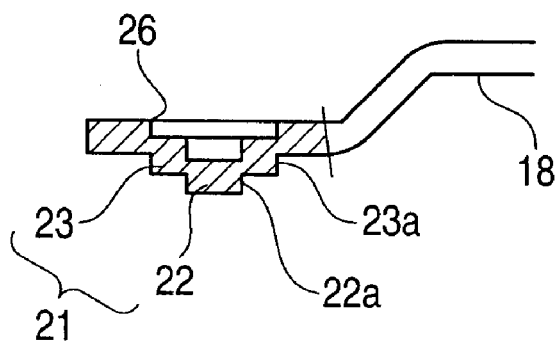
Figure 6:
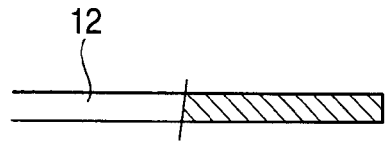
FIGS. 6(a) to (f) are explanatory views showing steps of forming a fitted hole in the heat radiation plate.
Figure 6:
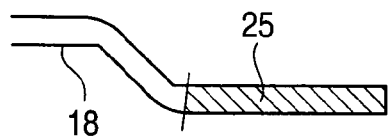
Figure 6:
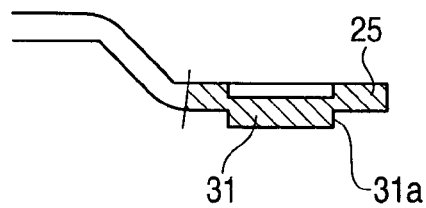
Figure 6:
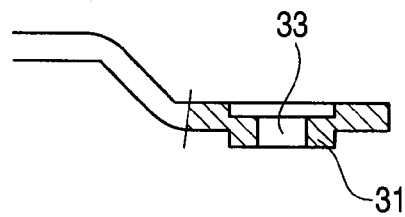
Figure 6:
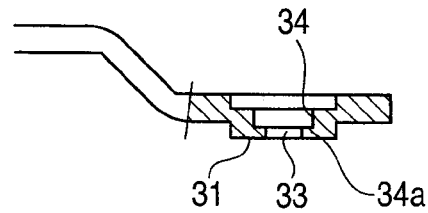
Figure 6:
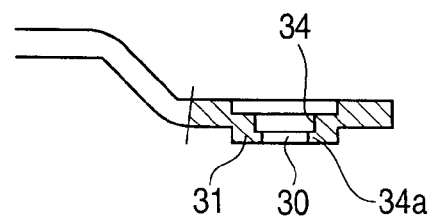

Here, steps of forming the fitting projection 21 and the fitted hole 30 on the metal plates 12a, 12b are shown in FIGS. 5 and 6 respectively.

FIG. 5 shows steps of forming the fitting projection 21 on the metal plates 12a, 12b. First, the housing recess portion 18 in which the semiconductor memories 17 are housed is formed (FIG. 5(b)) by applying the press working to a metal plate 12 formed as a flat plate shown in FIG. 5(a). The flat fitting edge portion 25 is formed in narrow width around the housing recess portion 18.

Then, the half-cut processing is applied to the fitting edge portion 25. Thus, a first projection 23 is formed to project from a face 25a, which contacts the circuit board 11, of the fitting edge portion 25 and have a circular planar shape (FIG. 5(c)). A level difference 26 is formed on the outer surface side of the fitting edge portion 25 of the metal plate 12 by the half-cut processing. The first projection 23 is projected from the inner surface to have a level difference that is almost equal to the above level difference.

Then, the half-cut processing is applied to the inner area of the first projection 23. Thus, a second projection 22 whose planar shape is a circle is formed concentrically with the first projection 23 (FIG. 5(d)). The second projection 22 is projected from a face of the first projection 23 by a level difference 22a.

In this manner, the fitting projection 21 consisting of the first projection 23 and the second projection 22, whose planar shapes are concentrically arranged and whose side surfaces are projected stepwise respectively from the face, which contacts the circuit board 11, of the fitting edge portion 25 formed on the metal plate 12, is formed.

FIG. 6 shows steps of forming the fitted hole 30 in the metal plate 12. FIGS. 6(a)(b) show the steps of forming the housing recess portion 18 by applying the press working to the metal plate 12.

FIG. 6(c) shows a situation that a projected portion 31, whose planar shape projected from the face 25a, which contacts the circuit board 11, of the fitting edge portion 25 is a circle, is formed by applying the half-cut processing to the fitting edge portion 25. The projected portion 31 is projected from the face 25a of the fitting edge portion 25 by a level difference 31a by the half-cut processing. Then, a through hole 33 is formed to pass through the projected portion 31 in a thickness direction (FIG. 6(d)), then a diameter-widened portion 34 is formed in an inner surface of the through hole 33 by widening the inner surface of the through hole 33 by the press working (FIG. 6(e)), and then the through hole 33 is shaped into the fitted hole 30 having a predetermined diameter by applying a shaving processing to the inner surface of the through hole 33 on the end surface side rather than the diameter-widened portion 34 (FIG. 6(f)).

Accordingly, the fitted hole 30 is formed in the projected portion 31 formed on the fitting edge portion 25 of the metal plate 12. A level difference 34a is formed on an inner surface of the projected portion 31 on the projected end side.

An inner diameter of the fitted hole 30 is set to have the same value as an outer diameter of the second projection 22 constituting the fitting projection 21. Also, an outer diameter of the first projection 23 constituting the fitting projection 21 and an outer diameter of the projected portion 31, in which the fitted hole 30 is formed, are set almost identically.

The processes of forming the fitting projection 21 and the projected portion 31 having the fitted hole 30 can be carried out subsequently to the step of forming the housing recess portion 18 by applying the press working to the metal plate 12 as a series of processes. Therefore, these processes can be carried out effectively as the method of processing the metal plates 12a, 12b.

As described above, the metal plates 12a, 12b fitted to both surfaces of the circuit board 11 have the perfectly identical shape containing configurations of the fitting projection 21 and the fitted hole 30. Therefore, such an advantage can be made that only one type of metal plate 12 may be processed.

FIG. 4 shows the memory module 10 in which the metal plates 12a, 12b, in which the fitting projections 21 and the fitted holes 30 are formed as the fixing members 20 by the above method, are fitted to the circuit board 11. FIG. 4(a) shows a neighborhood of the end edge portion of the memory module 10 in the longitudinal direction in an enlarged manner when the memory module 10 is viewed in the planar direction, and FIG. 4(b) shows a sectional view taken along a C-C line in FIG. 4(a).

The metal plates 12a, 12b are fitted by engaging the fitting projections 21 with the fitted holes 30 in the notches 29 provided in the circuit board 11 to put the circuit board 11 between them.

Figure 7:
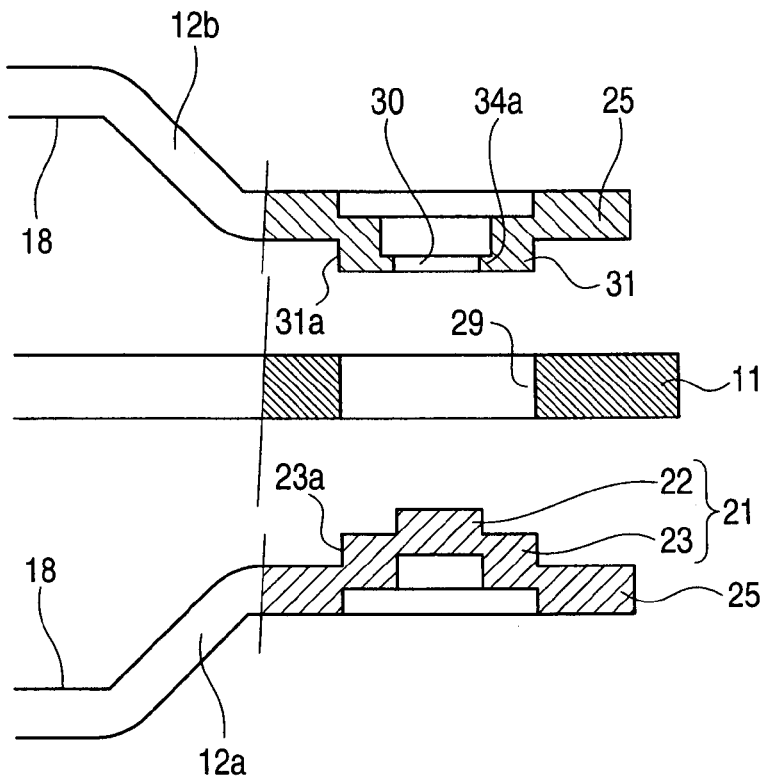
FIG. 7 is an explanatory view showing a method of assembling a semiconductor module.
Figure 8:
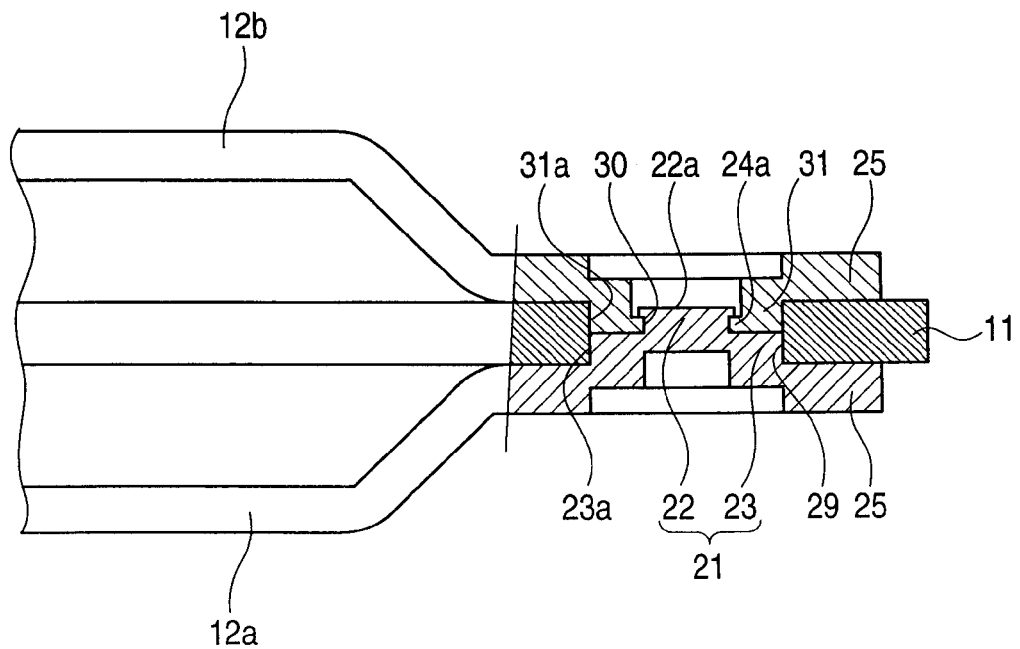
FIG. 8 is a sectional view showing a state that the heat radiation plate is fitted.

The method of fitting the metal plates 12a, 12b to the circuit board 11 to put the circuit board 11 between them is shown in FIG. 7 and FIG. 8 while enlarging their fitting portions.

FIG. 7 shows a situation that the metal plates 12a, 12b are arranged to put the circuit board 11 between them. The metal plates 12a, 12b are aligned with the notch 29 formed in the circuit board 11, and then positioned to oppose their opening side of the housing recess portion 18 to each other. The metal plates 12a, 12b are arranged to put the circuit board 11 between them in a situation that the fitting projection 21 and the fitted hole 30 are opposed mutually. In FIG. 7, a portion of one metal plate 12a in which the fitting projection 21 is formed and a portion of the other metal plate 12b in which the fitted hole 30 is formed are illustrated.

FIG. 8 shows a situation that the metal plates 12a, 12b are fitted to the circuit board 11. The first projection 23 formed on the metal plate 12a is inserted into the notch 29 from one side of the circuit board 11, and the projected portion 31 in which the fitted hole 30 is formed is inserted into the notch 29 from the other side of the circuit board 11. Accordingly, the metal plates 12a, 12b are positioned on the circuit board 11. Also, since a height sum of the level difference 23a of the first projection 23 and the level difference 31a of the projected portion 31 is set to coincide with a thickness of the circuit board 11, the metal plates 12a, 12b can be fitted to the circuit board 11 in a situation that the fitting edge portions 25 of the metal plates 12a, 12b come into touch with a surface of the circuit board 11.

When the first projection 23 and the projected portion 31 are inserted into the notch 29, the second projection 22 is inserted into the fitted hole 30. Then, a top end portion of the second projection 22 inserted into the fitted hole 30 is crashed to prevent the second projection 22 from being disconnected from the fitted hole 30. Since the level difference 34a is formed on the inner side of the projected end surface of the projected portion 31 and a diameter of the area inner than the level difference 34a is widened, the metal plates 12a, 12b can be fixed in a condition that the second projection 22 is prevented from being disconnected from the fitted hole 30 by crashing the second projection 22 from the metal plate 12b side. A reference 22a indicates the crashed portion of the second projection 22 that undergoes the crashing working.

The fixing members 20 are provided to the metal plates 12a, 12b to coincide with both end portions of the circuit board 11 in the longitudinal direction, and the fitting projection 21 is fitted into the fitted hole 30 and then the crashing working is applied to the fitting projection 21 to prevent a disconnection from the fitted hole 30. Therefore, the metal plates 12a, 12b can be simply fixed and fitted to the circuit board 11.

In FIG. 7 and FIG. 8, for convenience of explanation, the notch 29 in which the fitting projection 21 and the projected portion 31 in which the fitted hole 30 is formed are engaged with each other is illustrated as the circular through hole. The case where the fixing members 20 are engaged with the rectangular notches 29 whose outer side is opened, as shown in FIG. 2, can be applied totally similarly.

That is, in the memory module 10 of the present embodiment, in order to position the metal plates 12a, 12b in the length direction of the notch 29 (the short side of the circuit board 11), as shown in FIG. 3, the metal plates 12a, 12b are positioned by providing two fixing members 20 in parallel in the short-side direction of the circuit board 11 and arranging two first projections 23 and two projected portions 31 in parallel in the notches 29. FIG. 4 shows that the metal plates 12a, 12b are positioned by arranging two fixing members 20 in the notch 29 respectively.

In this way, when a plurality of fixing members 20 are formed in one edge end portion and the other edge end portion of the metal plates 12a, 12b, like the above embodiment, the same type of fixing members 20 may be formed collectively such that the fitting projections 21 may be formed on one edge end portion and the fitted holes 30 may be formed in the other edge end portion, otherwise different types of fixing members 20 may be formed in combination such that the fitting projection 21 and the fitted hole 30 may be formed on one edge end portion and the fitted hole 30 and the fitting projection 21 may be formed in the other edge end portion.

Figure 9:
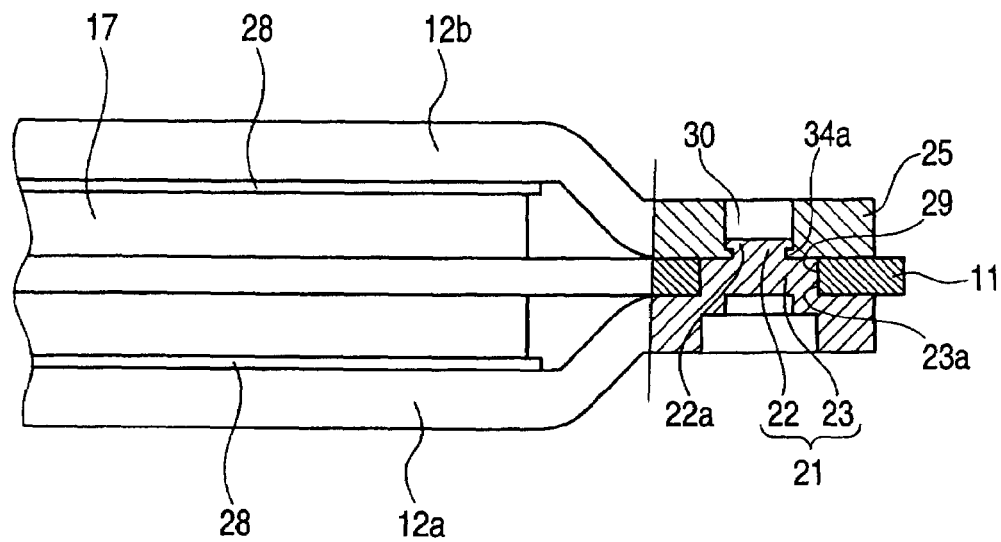
FIG. 9 is a sectional view showing a state that the heat radiation plate is fitted.

FIG. 9 shows another embodiment of the semiconductor module in which the metal plates 12a, 12b are fitted to the circuit board 11 by fitting the fitting projections 21 into the fitted holes 30. The present embodiment is characterized in that a projection height of the first projection 23 of the fitting projection 21 formed in the metal plates 12a, 12b is set equal to a thickness of the circuit board 11 and thus the fitted hole 30 is formed in the fitting edge portion 25 as it is not to provide the projected portion 31 to the metal plates 12a, 12b.

The method of fixing the metal plates 12a, 12b mutually in a state that the circuit board 11 is put between the metal plates 12a, 12b by providing the level difference 34a to the inner surface of the fitted hole 30 on the side that contacts the circuit board 11, inserting the second projection 22 into the fitted hole 30, and applying the crashing process to the projected end surface of the second projection 22 to prevent a removal of the fitting projection 21 from the fitted hole 30 is similar to the above embodiment.

In the present embodiment, the fitting holes via which the semiconductor module heat radiation plate is fitted are formed in symmetrical positions on both ends of the circuit board 11 in the longitudinal direction and then the fitting projections 21 are formed on one side of the metal plates 12a, 12b and the fitted holes 30 are formed in the other side of the metal plates 12a, 12b to correspond to the fitting holes. Therefore, the metal plates 12a, 12b can be fitted to the circuit board 11 only by preparing the totally same metal plates.

In this case, one side and the other side of the metal plates 12a, 12b signify that positions of the fitting projection 21 and the fitted hole 30 formed in the metal plates 12a, 12b can be selected exchangeably in design, and should not be interpreted that they specify particular positions of the metal plates 12a, 12b.

Also, in the above embodiment, an example in which the notches or the through holes are provided to both ends of the circuit board 11 formed like a rectangle in the longitudinal direction is explained. But the fitting positions in which the semiconductor module heat radiation plate is fitted to the circuit board 11 are not always limited to both ends of the circuit board 11 in the longitudinal direction.

However, in the memory module used normally, since the semiconductor memory or wiring patterns are formed on an almost overall surface of the circuit board 11, actually the fitting holes via which the semiconductor module heat radiation plate is fitted are limited to the outer peripheral portion of the circuit board 11. The semiconductor module heat radiation plate according to the present invention has such an advantage that, because the fitting projection 21 and the fitted hole 30 are formed and provided by the press working, the fitting structure used to fit the heat radiation plate, or the like can be formed without fail even in the narrow area such as the outer peripheral portion of the circuit board 11.

Also, the metal plates 12a, 12b are never protruded to the outside of a planar area of the circuit board 11 in a state that the metal plates 12a, 12b are fitted to the circuit board 11, and thus a size reduction of the semiconductor module can be achieved.

Also, according to the semiconductor module of the present embodiment, the fitting projections 21 formed on the metal plates 12a, 12b themselves and the fitted hole 30 are engaged with each other and then the metal plates 12a, 12b are coupled together and fixed mutually by the caulking process. Therefore, unlike the related art, there is no necessity to couple by using the rivets, and thus the number of assembled parts can be reduced and the manufacturing steps can be simplified.

Also, positioning between the metal plates 12a, 12b can be exactly conducted by aligning the fitting projections 21 with the fitted holes 30. Also, positioning between the circuit board 11 and the metal plates 12a, 12b can be simply and exactly conducted by aligning the fitting projections 21 and the fitted holes 30 (the projected portions 31) with the fitting holes (the through holes, the notches) provided to the circuit board 11.

Also, since the projected end portion of the fitting projection 21 undergoes the crashing process in the fitted hole 30 in caulking the fitting projection 21, the crashed portion is not protruded to the outside of the metal plates 12a, 12b, the extra projected portion is not formed, and an appearance clears out.

Figure 10:
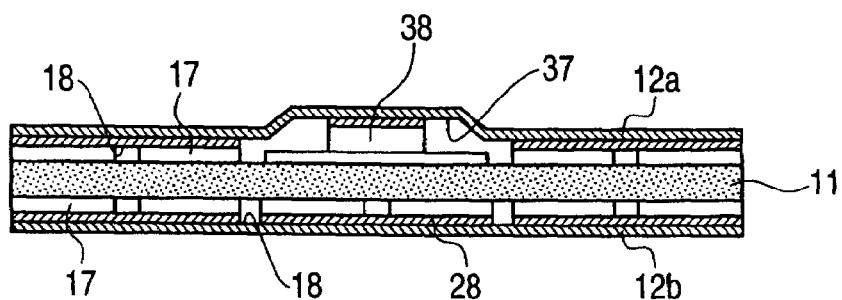
FIG. 10 is a sectional view of another embodiment of a semiconductor module.
Figure 11:
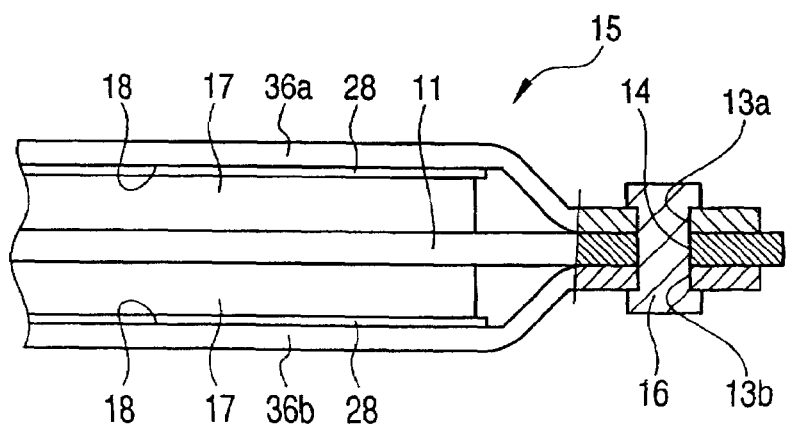
FIG. 11 is a partial sectional view showing the conventional approach of fitting the heat radiation plate to the circuit board.

Then, FIG. 10 shows an example in which the semiconductor module heat radiation plate according to the present invention is applied to the circuit board 11 on which an active device 38 is mounted. In this semiconductor module, the active device 38 is mounted in a center area on one surface of the circuit board 11 and the semiconductor memory 17 is arranged on right and left sides and on a back surface respectively. In this embodiment, in addition to the housing recess portion 18 in which the semiconductor memory 17 is housed, an auxiliary housing recess portion 37 into which the active device 38 is installed is provided. Like the housing recess portion 18, a depth dimension of the auxiliary housing recess portion 37 is set in such a way that a back surface of the active device 38 comes into touch with an inner surface of the auxiliary housing recess portion 37 when the metal plate 12a is fitted to the circuit board 11.

The method of fitting the metal plates 12a, 12b to the circuit board 11 by providing the fitting projections 21 and the fitted holes 30 to the fitting edge portions 25 of the metal plates 12a, 12b and then fitting the fitting projections 21 into the fitted holes 30 in the positions of the fitting holes provided to the circuit board 11 is similar to the case in the above embodiment.

In this case, in the semiconductor module of the present embodiment, since shapes of the metal plates 12a, 12b fitted to one surface and the other surface of the circuit board 11 are not perfectly identical, two types of metal plates 12a, 12b must be prepared.

A generation of heat from the active device 38 is increased in the circuit board 11 on which the active device 38 is mounted. Therefore, since the heat radiation plate is brought into direct contact with the active device 38 and the semiconductor memory 17 or the heat radiation plate is brought into contact with them via the thermal conduction tape 28, a heat dissipation capacity from the active device 38 and the semiconductor memory 17 can be improved and also reliability of the semiconductor module can be improved.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A semiconductor module comprising:
a circuit board;
semiconductor devices mounted on both surfaces of the circuit board; and
heat radiation plates provided to the both surfaces of the circuit board to cover the semiconductor devices,
wherein the circuit board has a fitting hole through which the heat radiation plates are fitted, and
wherein each of the heat radiation plates has a fitting edge portion in a position of the heat radiation plate that overlaps with a position in which the fitting hole is formed, and each of the heat radiation plates has a fixing member, which is provided at the fitting edge portion and integrally with the heat radiation plate, for fixing both of the heat radiation plates to the circuit board by caulking to align with the fitting hole,
wherein each of the fixing members is received in said fitting hole, and wherein the fixing member formed on one of the heat radiation plates includes a fitting projection and the fixing member formed on the other of the heat radiation plates defines a fitted hole; and
wherein the fitting projection has a first projection inserted into the fitting hole and a second projection extending from an end surface of the first projection and received in said fitted hole.

2. A semiconductor module comprising:
a circuit board;
semiconductor devices mounted on both surfaces of the circuit board; and
heat radiation plates provided to the both surfaces of the circuit board to cover the semiconductor devices,
wherein the circuit board has a fitting hole through which the heat radiation plates are fitted, and
wherein each of the heat radiation plates has a fitting edge portion in a position of the heat radiation plate that overlaps with a position in which the fitting hole is formed, and each of the heat radiation plates has a fixing member, which is provided at the fitting edge portion and integrally with the heat radiation plate, for fixing both the heat radiation plates to the circuit board by caulking to align with the fitting hole,
wherein the fitting hole is formed in plural as a paired arrangement in which arrangement positions are common on front and back surfaces of the circuit board, and
the fixing member formed to correspond to one fitting hole as the paired arrangement and the fixing member formed to correspond to other fitting hole as the paired arrangement are formed on both heat radiation plates as paired structures that are fitted mutually and fixed by caulking.

3. The semiconductor module according to claim 2, wherein the fitting hole is formed as a notch in both end edges of the circuit board in a longitudinal direction respectively.

4. The semiconductor module according to claim 2, wherein one of the fixing members is formed as a fitting projection and other of the fixing members is formed as a fitted hole that is combined with the fitting projection.

5. The semiconductor module according to claim 1,
wherein the fitted hole is formed to have a diameter dimension through which the second projection is inserted into a projected portion that is inserted into the fitting hole, and then fixed by caulking, and
wherein a height sum of the first projection and a level difference portion of the projected portion coincides with a thickness of the circuit board.

6. The semiconductor module according to claim 1,
wherein the fitted hole is formed to have a diameter dimension through which the second projection is inserted and then fixed by caulking, and
wherein a height of a level difference portion of the first projection coincides with a thickness of the circuit board.

7. A semiconductor module heat radiation plate used in assembling the semiconductor module in which a fitting hole formed in a circuit board is formed in plural as a paired arrangement in which arrangement positions are common on front and back surfaces of the circuit board, the heat radiation plate comprising:
- a first fixing member formed to correspond to one fitting hole as the paired arrangement; and
- a second fixing member formed to correspond to other fitting hole as the paired arrangement,
- wherein the first and second fixing members are formed on the heat radiation plate as paired structures with the other heat radiation plate with the same structure so that the first and second fixing members of the heat radiation plate are fitted mutually and fixed by caulking to those of the other heat radiation plate.

8. The semiconductor module heat radiation plate according to claim 7, wherein the first fixing member is formed as a fitting projection and the second fixing member is formed as a fitted hole that is combined with the fitting projection.

9. The semiconductor module according to claim 1, wherein each of the heat radiation plates has a housing recess portion in which the semiconductor device is housed.

10. The semiconductor module according to claim 1, wherein the fitting edge portions are provided within a board plane of the circuit board on an outside of the housing recess portion.

11. The semiconductor module according to claim 2, wherein each of the heat radiation plates has a housing recess portion in which the semiconductor device is housed.

12. The semiconductor module according to claim 2, wherein the fitting edge portions are provided within a board plane of the circuit board on an outside of the housing recess portion.

* * * * *